(12) United States Patent
Wilby et al.

(10) Patent No.: US 11,361,975 B2
(45) Date of Patent: Jun. 14, 2022

(54) METHOD OF FABRICATING INTEGRATED CIRCUITS

(71) Applicant: SPTS Technologies Limited, Newport (GB)

(72) Inventors: Tony Wilby, Newport (GB); Steve Burgess, Newport (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 16/601,358

(22) Filed: Oct. 14, 2019

(65) Prior Publication Data

US 2020/0135490 A1 Apr. 30, 2020

(30) Foreign Application Priority Data

Oct. 25, 2018 (GB) ..................................... 1817370

(51) Int. Cl.
*H01L 21/02* (2006.01)
*H01L 21/3213* (2006.01)
*H01L 21/768* (2006.01)

(52) U.S. Cl.
CPC .. *H01L 21/32136* (2013.01); *H01L 21/32134* (2013.01); *H01L 21/76895* (2013.01)

(58) Field of Classification Search
CPC ......... H01L 21/32136; H01L 21/32134; H01L 21/76895; H01L 22/26; H01L 21/32131; H01L 24/03; H01L 2224/05017; H01L 24/13; H01L 24/05; H01L 2224/13006; H01L 2224/13147; H01L 2224/0401; H01L 2224/05166; H01L 2224/05647; H01L 2224/0361; H01L 2224/03614; H01J 37/32871; H01J 37/32926; H01J 37/32972

See application file for complete search history.

(56) References Cited

U.S. PATENT DOCUMENTS 5,356,478 A * 10/1994 Chen ................. H01L 21/67028
134/1
5,362,356 A * 11/1994 Schoenborn ...... H01L 21/28026
216/60
7,687,311 B1 3/2010 Lee et al.
(Continued)

FOREIGN PATENT DOCUMENTS

CN 103107085 B 2/2016
CN 105355574 A 2/2016

OTHER PUBLICATIONS

EPO, ESR for EP19200138, Feb. 20, 2020.

*Primary Examiner* — Duy Vu N Deo
(74) *Attorney, Agent, or Firm* — Hodgson Russ LLP

(57) ABSTRACT

A method of fabricating an integrated circuit is disclosed. The method of removing excess metal of a metal interconnection layer during integrated circuit fabrication process comprises the steps of: plasma etching an excess metal portion of the metal interconnection layer using plasma comprising a noble gas, for an etch duration. The method further comprises stopping the etch process prior to the excess metal portion being completely removed and thus prior to a dielectric surface upon which the metal interconnection is formed, becoming completely exposed. The remaining excess metal portion comprising excess metal residues is subsequently removed using a second etch step.

16 Claims, 6 Drawing Sheets

(56) References Cited

U.S. PATENT DOCUMENTS

| | | | |
|---|---|---|---|
| 2004/0043526 A1* | 3/2004 | Ying | B82Y 40/00 |
| | | | 438/38 |
| 2006/0172444 A1* | 8/2006 | Jungnickel | H01L 24/12 |
| | | | 438/14 |
| 2008/0079461 A1 | 4/2008 | Lin et al. | |
| 2011/0155692 A1* | 6/2011 | Yau | H01L 21/31144 |
| | | | 216/41 |
| 2012/0009777 A1 | 1/2012 | Liu et al. | |
| 2016/0099173 A1* | 4/2016 | Agarwal | H01J 37/321 |
| | | | 438/714 |
| 2018/0047674 A1 | 2/2018 | Tsai et al. | |

\* cited by examiner

| C | N | O | Si | Ar | Ti | Cu |
|---|---|---|---|---|---|---|
| 65.2 | 2.6 | 21.5 | 5.4 | 0.4 | 3.0 | 2.0 |

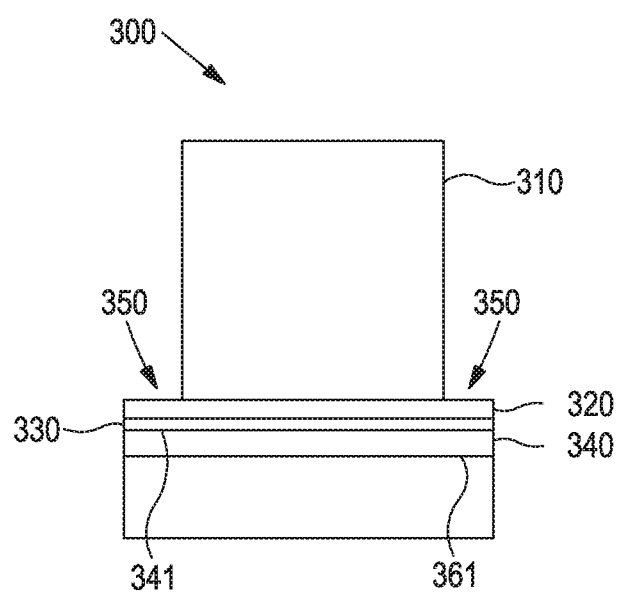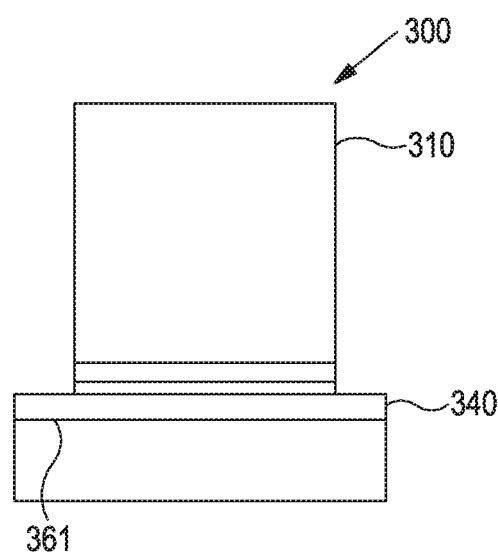
Figure 9     Figure 10
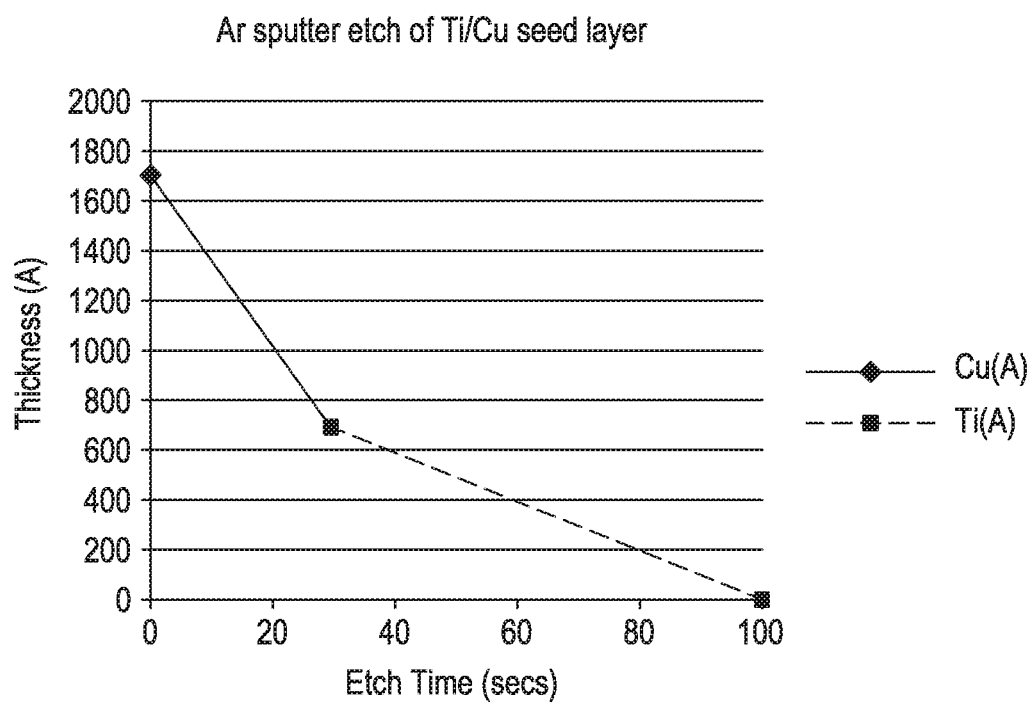
Figure 11

METHOD OF FABRICATING INTEGRATED CIRCUITS

BACKGROUND

The present invention relates to a method of fabricating integrated circuits. In particular, the invention relates to removing excess metal of a metal interconnection layer during integrated circuit fabrication process, wherein the metal interconnection layer is disposed between a dielectric layer and an integrated circuit.

Referring to FIG. 1 of the drawings, in many advanced packaging processes, under-bump metal (UBM) layers are formed using physical vapour deposition (PVD) prior to the electro-deposition of copper pillars 10 or copper redistribution layers (RDL). The UBM typically comprises a barrier layer 13, for example a titanium (Ti) layer, a titanium-tungsten alloy (TiW) or equivalent layer, or a combination of layers of titanium nitride and titanium (TiN/Ti) for example, and a copper (Cu) seed layer 12 which carries current during the copper electroplating process. These seed layers are deposited onto an organic dielectric 14, typically polyimide (PI) 14 or polybenzoxazole (PBO) which overlays a substrate 15. Once the electroplating process is finished, the undesired portions of UBM are removed by wet etching to electrically isolate the newly formed structures.

Conventionally, the Cu seed layer 12 is removed using ammonical etching, in which alkaline etchants, including $Cu(NH_3)_4Cl_2$, $Cu(NH_3)_2Cl$, $NH_3$ and $NH_4Cl$, are used. The resulting chemicals including CuO are then cleaned using $NH_3$ and water. This process however provides no selectivity of vertical etching over lateral etching and therefore causes undesirable loss of copper structure width (FIG. 2). This problem sets a lower limit on a size of a copper pillar 10 and pitch After copper etch, the exposed portions of the barrier layer 13 such as Ti are then wet etched using a hydrofluoric acid (HF) solution. It is observed that undercuts 11 are formed due to the lateral etching of the barrier layer (FIG. 2). In consequence, the entire structure is weakened and may delaminate resulting in a low yield and/or reliability.

After removal of the Ti/Cu seed 12, 13 by wet etching, the Cu pillar width is reduced and the Ti layer 13 shows an undercut 11 due to the isotropic nature of the etch processes used. It is known to replace the isotropic wet etch process with an anisotropic dry etch that solves the above issues, but a number of problems with such an approach have been identified.

Firstly, it is well known within the industry that Cu cannot be etched successfully using standard metal etch plasma processes, as no volatile $CuF_x$ or $CuCl_x$ compounds are formed. However, an Argon, Ar, dry etch process can be used to physically sputter the Cu seed 12. Due to the directionality caused by the platen bias, such a process will etch faster vertically than laterally and so avoids the problems described above.

To ensure proper device functionality, it is important that the metal surfaces are free from any organic residues that may affect adhesion. It is also critical that the PI 14 or other dielectric is free from any metallic residues that would cause an increase in line-to-line leakage current. For this reason, it is common to employ an over-etch to ensure all areas of the wafer are etched sufficiently. These requirements present a specific challenge when using a sputter etch process as described below.

During the etch process, metal will be sputtered onto the surface of the dielectric 14 and potentially even implanted into the dielectric 14 where it will cause leakage current issues and reliability problems.

During the over-etch, carbon and oxygen will be released from the exposed dielectric into the process ambient where it can contaminate the exposed metal surfaces. This carbon contamination can be problematic as it will form metallic carbides which are very difficult to remove by standard methods, for example $O_2$ ashing. Data illustrating these problems is shown on FIGS. 3 to 6, which relate to a sample processed using an Ar sputter etch to clear a Ti/Cu seed layer (including a 50% over etch). FIG. 4 shows a significant (9.6%) carbon contamination. FIG. 6 shows considerable metal implantation into the dielectric (3% Ti, 2% Cu).

SUMMARY

It is an object of the present invention to provide a technical solution to the issues outlined above.

In accordance with a first aspect of the present invention, there is provided a method of removing excess metal of a metal interconnection layer during integrated circuit fabrication process, the metal interconnection layer being disposed between a dielectric layer and an integrated circuit, the method comprising the steps of:

plasma etching an excess metal portion of the metal interconnection layer for an etch duration, using a plasma comprising a noble gas, the excess metal portion being disposed on a surface of the dielectric layer;

controlling the etch duration so as to stop the plasma etching before the excess metal portion is completely removed from the dielectric layer;

etching the remaining excess metal portion to remove excess metal residues from the dielectric layer.

In an embodiment, the noble gas comprises argon.

In an embodiment, the etching of the remaining excess metal portion comprises wet chemical etching, however, in an alternative embodiment, this may be performed via chemical dry etching.

In an embodiment, the chemical dry etching comprises etching using a fluorocarbon, such as tetrafluoromethane. Alternatively, or in addition thereto, the chemical dry etching comprises etching using chlorine.

In an embodiment, the excess metal portion comprises a barrier layer or layers disposed on the dielectric layer and a copper layer disposed on the barrier layer(s). The excess metal residues may comprise barrier layer residues.

In an embodiment, the method further comprises dynamically calculating the etch duration during the etch process. The etch duration may be set when the surface of the dielectric layer is detected during the plasma etching. In an embodiment, the surface of the dielectric layer is detected using optical emission spectroscopy (OES) or secondary ion mass spectroscopy (SIMS).

In an embodiment, the method further comprises calculating the etch duration prior to plasma etching, the etch duration being calculated based on a known etch rate of the excess metal portion.

In an embodiment, the step of plasma etching the excess metal portion comprises preferentially etching the excess metal portion along a direction substantially transverse to the metal interconnection layer.

In accordance with a second aspect of the invention, there is provided an integrated circuit obtainable by a method according to the first aspect.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments.

Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

BRIEF DESCRIPTION OF THE DRAWINGS

The invention may be performed in various ways, and, by way of example only, embodiments thereof will now be described with reference to the accompanying drawings, in which:

FIG. 9 shows a copper pillar structure before seed removal.

FIG. 10 shows a copper pillar structure of FIG. 9 after seed removal by dry etching, with the improvement in etch profile.

FIG. 11 shows a graphical representation of Ti/Cu seed thickness vs. etch time of Ar sputter etching, achieved using the method illustrated in either of FIG. 7 or 8.

DETAILED DESCRIPTION OF EMBODIMENTS

The present invention will now be described in detail. It has been found that the embodiments of the present invention minimise the implanting re-sputtered metal into a dielectric layer, and minimise a contamination of the metal surface with carbon released from exposed polymer. The undesirable lateral etching of Cu pillars or RDL is also significantly reduced. The invention also solves the Ti layer undercut problem and leaves the metal layer free of contamination.

Figure 1:
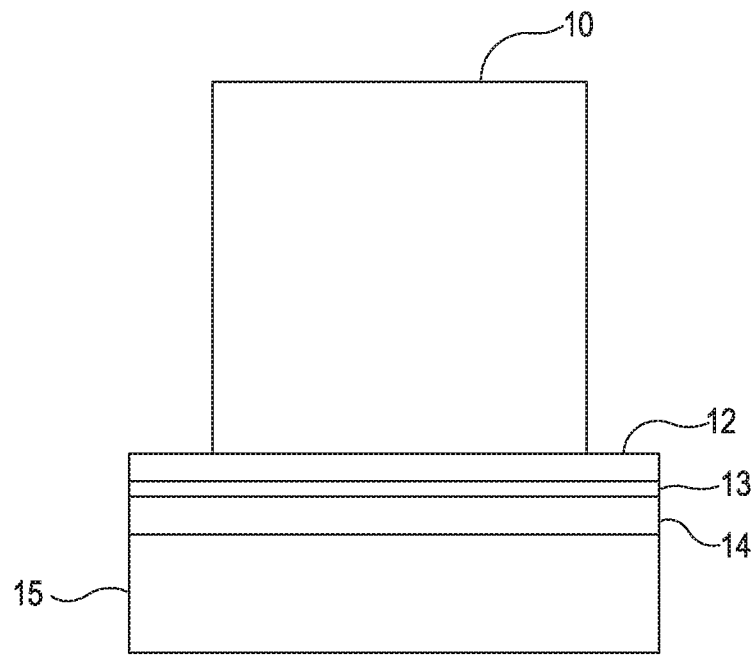
FIG. 1 shows a copper pillar structure before seed removal.
Figure 2:
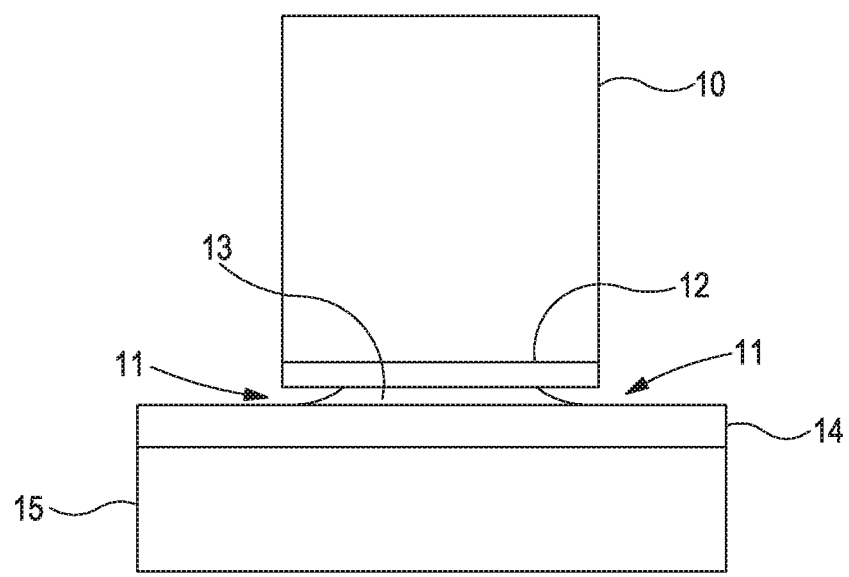
FIG. 2 shows a copper pillar structure of FIG. 1 after seed removal by wet etching.
Figure 3:
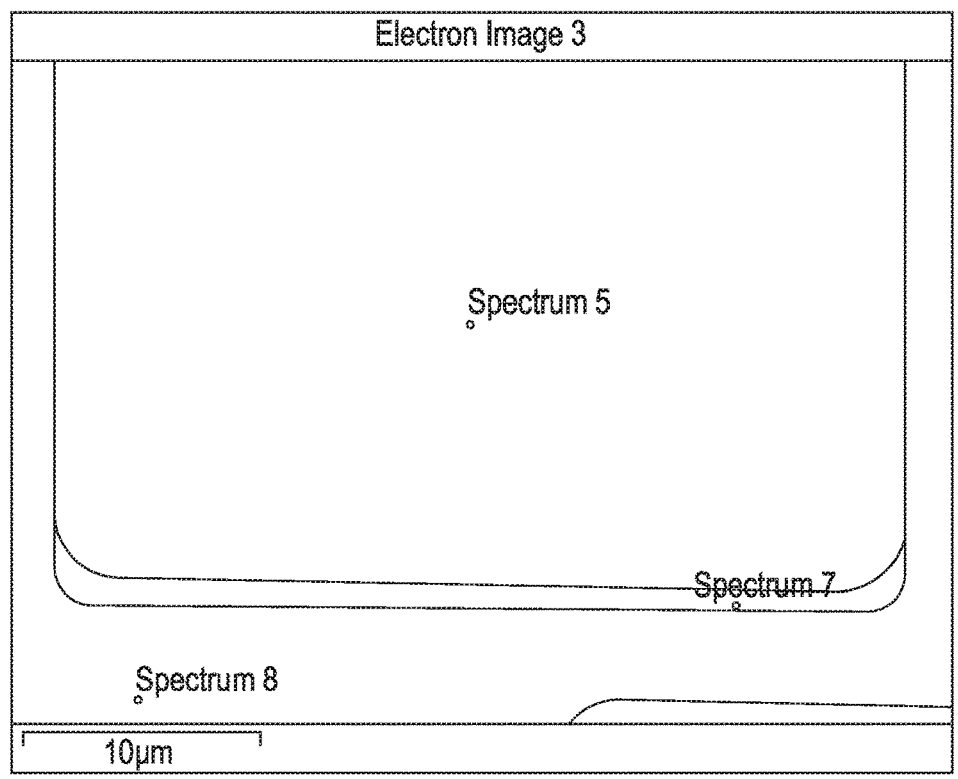
FIG. 3 shows a scanning electron microscope (SEM) image of a carbon-contaminated redistribution layer (RDL) metal following Ar sputter etching.
Figure 4:
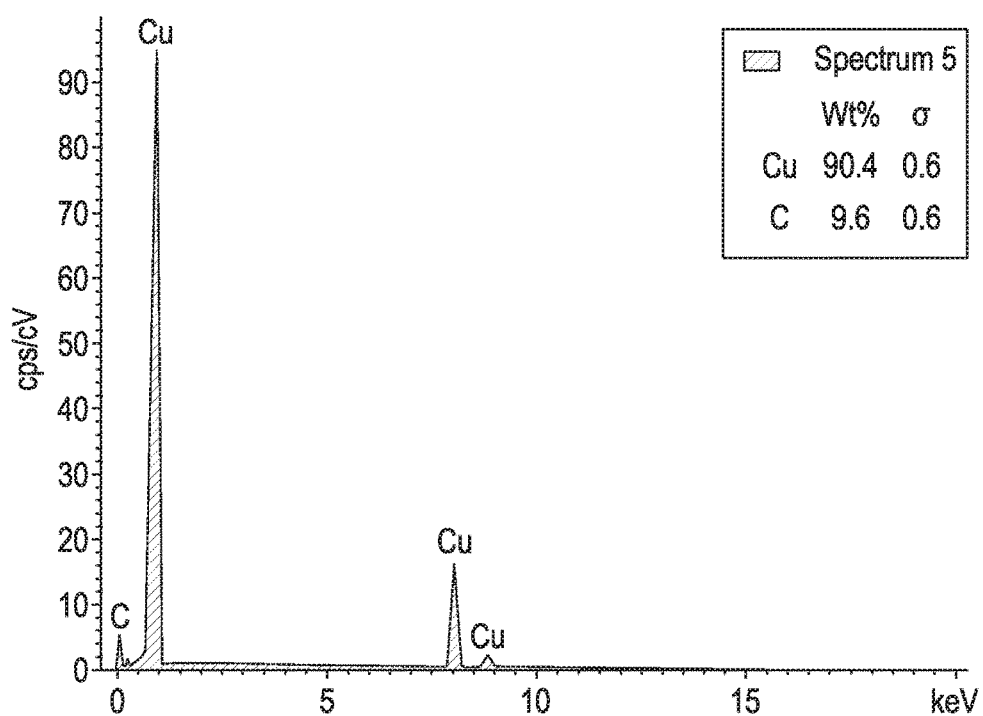
FIG. 4 shows an energy-dispersive X-ray (EDX) spectrum of RDL metal following Ar sputter etching (9.6% C).
Figures 5, 6:
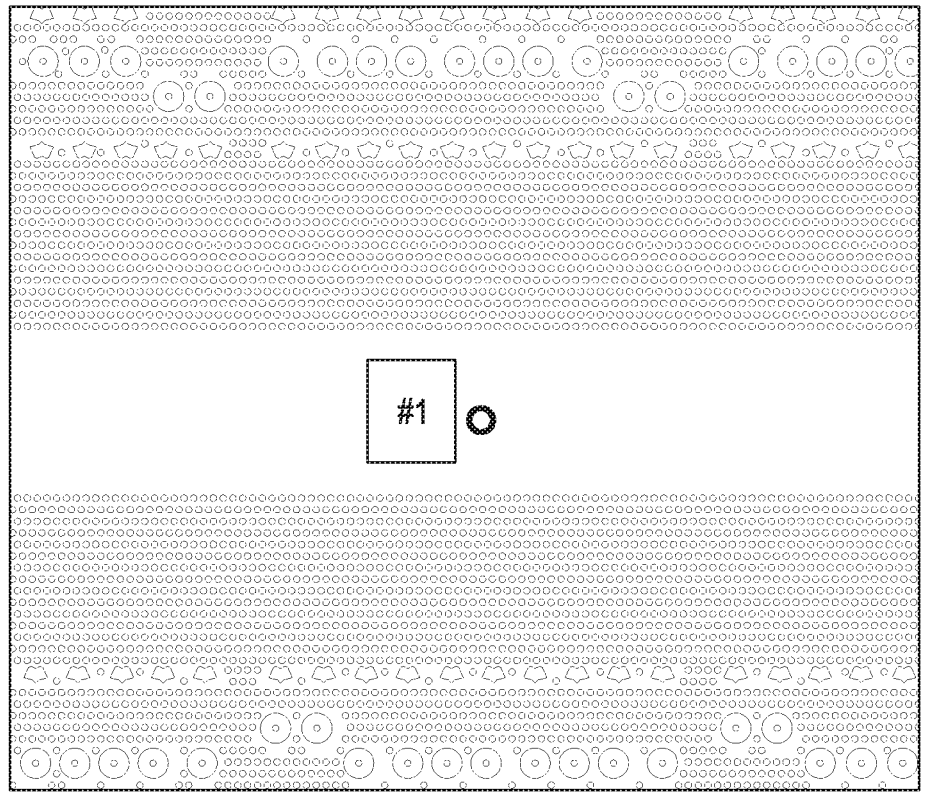
FIG. 5 shows an optical micrograph with visible metal residues on dielectric following Ar sputter etching.
FIG. 6 is a table indicating a composition of a surface of a dielectric as measured by XPS in scribe lane, showing metal residues (3% Ti, 2% Cu) on dielectric following Ar sputter etching.
Figure 7:
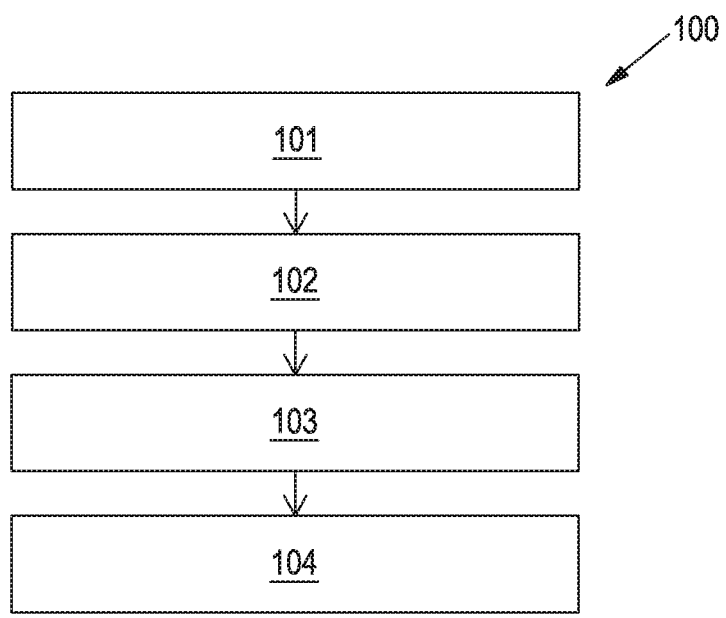
FIG. 7 shows a flowchart illustrating steps of a method according to a first embodiment of the present invention.

Referring to FIGS. 7 and 9-10 of the drawings, there is illustrated a flowchart showing steps of a method 100 of removing excess metal of a metal interconnection layer 320, 330 during integrated circuit fabrication process, according to a first embodiment of the present invention. In particular, the metal interconnection layer 320, 330 may comprise under-bump metal (UBM) layer 320, 330 which may include a copper layer 320 and barrier layer 330 such as Ti, TiW or tantalum (Ta) for example. The metal interconnection layer 320, 330 may separate a copper pillar 310 from the wafer surface 361 overlaid with the dielectric layer 340.

At step 101, a plasma etching duration may be calculated prior to plasma etching at step 102, wherein the etch duration is calculated based on a known etch rate of the excess metal portion 350, such as a known etch rate of copper layer 320 and a known etch rate of barrier layer 330.

At step 102, an excess metal portion 350 of the metal interconnection layer 320, 330 is plasma etched using plasma comprising a noble gas, for an etch duration, the excess metal portion 350 being disposed on a surface 341 of the dielectric layer 340. In particular, plasma etching 102 may comprise a directional or anisotropic sputter etch using plasma containing argon, which comprises etching the excess metal portion 350 preferentially along a vertical direction, namely substantially transverse to the metal interconnection layer 320, 330, and around the integrated circuit 300. This step facilitates metal width control and minimises undercutting.

At step 103, the etch duration is controlled so as to stop the plasma etching 102 before the metal portion 350 is completely removed from the dielectric 340, which would otherwise completely expose a surface 341 of the dielectric layer 340. The etch duration is calculated at step 101 based on the known etch rate of the excess metal portion 350. In particular, the plasma etching is stopped before the metal portion 350 is completely removed, and thus before the dielectric layer 340 is exposed or is fully exposed, to avoid any over-etching. As illustrated in FIG. 11 for example, sputter etching 102 of the excess metal portion 350 comprising copper layer 320 and titanium layer 330, using plasma containing argon for 30 seconds will etch the copper layer 320 and expose the titanium layer 330 by reducing the thickness of the excess metal portion 350 from 1700 Å to 700 Å. Sputter etching 102 for further 70 seconds will completely remove the 700 Å thick titanium layer 330. It therefore follows that Ar sputter etching time threshold of 90 seconds is sufficient to completely remove the copper layer 320 and most of the titanium layer 330 without exposing the dielectric layer 340.

At step 104, the exposed surface of the dielectric layer 340 is cleared by etching for a further etch duration, to remove excess metal residues, such as titanium residues, from the surface 341 of the dielectric layer 340. Etching the surface 341 of the dielectric layer 340 at step 104 may comprise liquid or wet chemical etching or chemical dry etching. Chemical dry etching may be performed using a fluorocarbon such as tetrafluoromethane ($CF_4$), or using chlorine (Cl). By stopping the plasma etching 102 when only minimal excess metal residues remain on the surface 341 of the dielectric layer 340, it is possible to use a much shorter wet etch time than would normally be possible. This will result in a reduced undercut of the metal interconnection layer 320, 330 and will minimises any contamination of a wafer surface 361.

Figure 8:
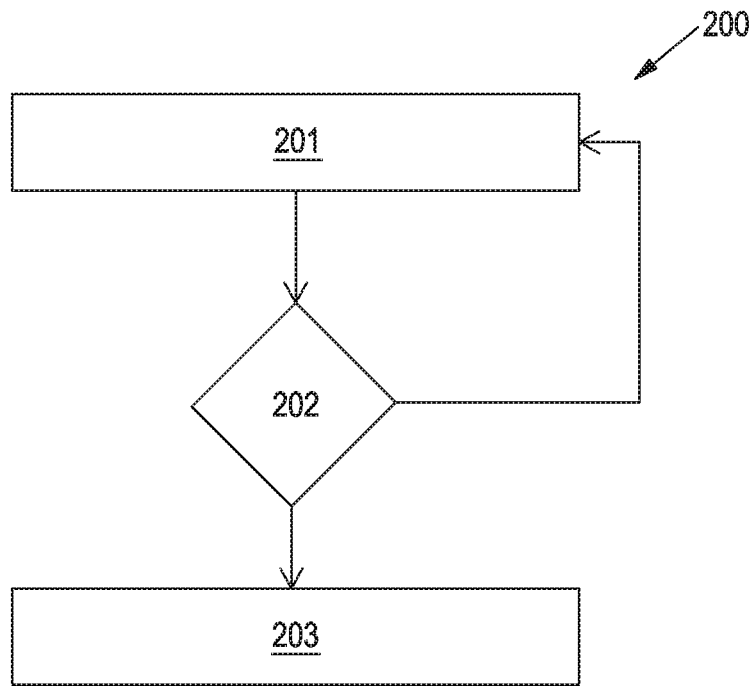
FIG. 8 shows a flowchart illustrating steps of a method according to a second embodiment of the present invention.

FIG. 8 shows second embodiment of a method 200 of removing excess metal of a metal interconnection layer 320, 330 during integrated circuit fabrication process. Step 201 corresponds to step 102 of the method 100. At step 202, a duration of the plasma etching time is controlled so as to stop the plasma etching 201 before the metal portion 350 is completely removed which would otherwise completely expose the surface 341 of the dielectric layer 340. The etch duration may be dynamically calculated at step 202 so as to be set when the surface 341 of the dielectric layer 340 is detected during the plasma etching 201. In particular, the surface 341 of the dielectric layer 340 may be detected using optical emission spectroscopy (OES) or secondary ion mass spectroscopy (SIMS). The plasma etching at step 201 therefore continues until step 202 where the surface 341 of the dielectric layer 340 is detected. Once the dielectric layer 340 is detected, wet etching at step 203 will be performed, corresponding to step 104 of the method of the first embodiment.

Figure 12:
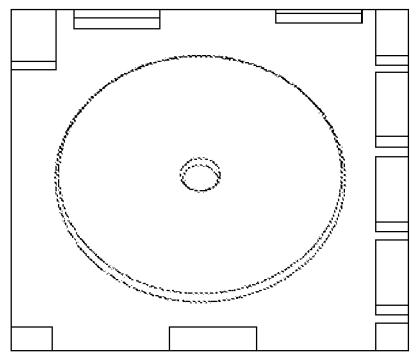
FIG. 12 shows a scanning electron microscope (SEM) image of a redistribution layer (RDL) metal, achieved using the method illustrated in either of FIG. 7 or 8.
Figure 13:
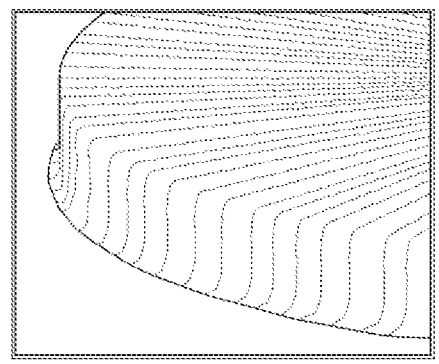
FIG. 13 shows another scanning electron microscope (SEM) image of a redistribution layer (RDL) metal, achieved using the method illustrated in either of FIG. 7 or 8.
Figure 14:
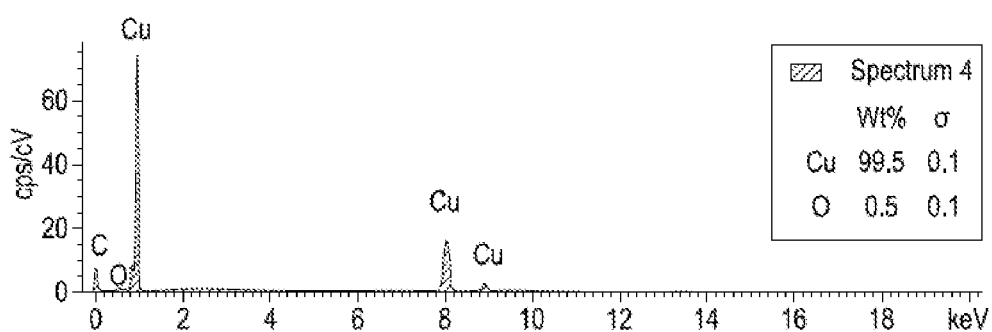
FIG. 14 shows an energy-dispersive X-ray (EDX) spectrum of RDL metal, achieved using the method illustrated in either of FIG. 7 or 8.

FIGS. 12 and 13 illustrate a scanning electron microscope (SEM) image of a redistribution layer (RDL) metal achieved using a method 100 according to the present invention. It is apparent that there are no undercuts in the illustrated structures. FIG. 14 shows an energy-dispersive X-ray (EDX) spectrum of RDL metal achieved using the method 100 according to the first embodiment. The detected content includes 99.5% pure copper and there is no significant carbon contamination detected.

What is claimed is:

1. A method of removing excess metal of a metal interconnection layer during an integrated circuit fabrication process, the method comprising the steps of:
    plasma etching an excess metal portion of the metal interconnection layer for an etch duration using a plasma comprising a noble gas, the metal interconnection layer being disposed on a dielectric layer, the excess metal portion being disposed on a surface of the dielectric layer, wherein the excess metal portion comprises at least one barrier layer disposed on the dielectric layer and a copper layer disposed on the barrier layer, wherein the noble gas comprises argon and the dielectric layer includes an organic dielectric;
    controlling the etch duration to remove at least some of the copper layer disposed on the barrier layer and at least some of the barrier layer so as to stop the plasma etching before the excess metal portion is completely removed from the dielectric layer whereby the surface of the dielectric layer is not exposed to the plasma; and
    etching the remaining excess metal portion to remove excess metal residues from the dielectric layer.

2. A method according to claim 1, wherein the etching of the remaining excess metal portion comprises wet chemical etching.

3. A method according to claim 1, wherein the etching of the remaining excess metal portion comprises chemical dry etching.

4. A method according to claim 3, wherein the chemical dry etching comprises etching using a fluorocarbon.

5. A method according to claim 4, wherein the fluorocarbon comprises tetrafluoromethane.

6. A method according to claim 3, wherein the chemical dry etching comprises etching using chlorine.

7. A method according to claim 1, wherein the excess metal residues comprise barrier layer residues.

8. A method according to claim 1, further comprising dynamically calculating the etch duration during the etch process.

9. A method according to claim 8, wherein the etch duration is set when the surface of the dielectric layer is detected during the plasma etching.

10. A method according to claim 8, wherein the surface of the dielectric layer is detected using optical emission spectroscopy (OES) or secondary ion mass spectroscopy (SIMS).

11. A method according to claim 1, further comprising calculating the etch duration prior to the plasma etching, wherein the etch duration is calculated based on a known etch rate of the excess metal portion.

12. A method according to claim 1, wherein the step of plasma etching the excess metal portion comprises preferentially etching the excess metal portion along a direction substantially transverse to the metal interconnection layer.

13. An integrated circuit obtainable by a method according to claim 1.

14. A method according to claim 1, wherein the metal interconnection layer is disposed between the dielectric layer and a copper pillar of an integrated circuit.

15. A method according to claim 1, wherein the barrier layer includes Ti, TiW, or Ta.

16. A method according to claim 1, wherein the organic dielectric is a polyimide or polybenzoxazole.

* * * * *